(12) United States Patent
Aikins (10) Patent No.: US 7,715,574 B2
(45) Date of Patent: May 11, 2010

(54) AUDIO APPARATUS FOR VESSEL

(75) Inventor: James Edward Aikins, Modesto, CA (US)

(73) Assignee: James E. Aikins, Modesto, CA (US)

(*) Notice: Subject to any disclaimer, the term of this patent is extended or adjusted under 35 U.S.C. 154(b) by 1291 days.

(21) Appl. No.: 11/192,815

(22) Filed: Jul. 29, 2005

(65) Prior Publication Data

US 2006/0029237 A1   Feb. 9, 2006

Related U.S. Application Data (60) Provisional application No. 60/599,134, filed on Aug. 4, 2004.

(51) Int. Cl.
*H03G 3/00* (2006.01)
*H03G 7/00* (2006.01)
*H04B 1/001* (2006.01)

(52) U.S. Cl. .......................... 381/107; 381/86; 381/104; 381/106

(58) Field of Classification Search ......... 381/102–109, 381/86

See application file for complete search history.

(56) References Cited

U.S. PATENT DOCUMENTS

| | | | |
|---|---|---|---|
| 4,476,571 A | 10/1984 | Tokumo | |
| 4,479,237 A | 10/1984 | Sugasawa | |
| 4,553,257 A | 11/1985 | Mori | |
| 4,558,460 A * | 12/1985 | Tanaka et al. | 381/86 |
| 4,628,526 A | 12/1986 | Germer | |
| 4,644,292 A | 2/1987 | Kunugi | |
| 4,742,310 A | 5/1988 | Kato | |
| 4,864,246 A | 9/1989 | Kato | |
| 5,027,432 A | 6/1991 | Skala | |
| 5,034,984 A | 7/1991 | Bose | |
| 5,081,682 A | 1/1992 | Kato | |
| 5,107,539 A | 4/1992 | Kato | |

* cited by examiner

*Primary Examiner*—Devona E Faulk (57) ABSTRACT

An apparatus (12) which overcomes the foregoing inconveniences of manually adjusting the audio device (10) volume related to a vessels speed and participants distance behind the vessel in a towable activity. This apparatus (12) controls audio volume levels (14) set at V2 and (16) set at V1 where V2 is greater than V1 and audio volume level (14) is achieved when vessels engine or propulsion shaft RPM is above set point (22) for a time greater than designated by (24), thereby controlling audio volume as a relation to vessel speed.

20 Claims, 6 Drawing Sheets

AUDIO APPARATUS FOR VESSEL

CROSS-REFERENCE TO RELATED APPLICATIONS

This application is entitled to the benefit of Provisional Patent Application Ser. No. 60/599,134 filed, 2004 Aug. 4 by the present inventor.

BACKGROUND

This invention relates to an automatic audio device specifically installed on a boat or vessel to control audio volume related to engine or propulsion shaft RPM correlating to vessel speed.

DISCUSSION OF PRIOR ART

U.S. Pat. No. 4,558,460 Tanaka (1985) shows an apparatus, which can be simplified since its operation of sound is not enclosed in the vessel and audio volume may be a function of the distance related to a participant behind the vessel. Preset adjustable volume levels will be selected as a function of engine RPM or propulsion shaft RPM which correlates to vessel speed. In addition, in a previously known apparatus, U.S. Pat. No. 4,476,571 Tokumo (1984) noise related to a motor vehicle is detected and the audio volume is automatically increased or decreased according to the amount of detected noise. This type of apparatus, however, is inconvenient because it is complex in construction and high in price. It requires a microphone for detecting the amount of noise and a filter circuit for discriminating between noise and sound emitted from the audio system. A previously known apparatus, U.S. Pat. No. 5,677,960 to Unno (1997) also monitors electrical generation current to control audio volume as a function of vehicle speed in a variable manner to maintain what the operator perceives as a constant volume level related to increased external noises from changes in driving conditions related to vehicle speed. This device is also complex in circuitry to have a variable volume in relation to speed of a vehicle.

Accordingly, several objects and advantages of the invention are to provide a simple apparatus to control audio volume levels as a function of vessel speed typically linearly related to engine RPM or propulsion shaft RPM due to single speed transmissions. Allow for a time delay prior activation of volume change for vessel low speed maneuvering due to frequent high engine RPM's for short time periods. Allow for the use of multiple installations of the apparatus to have different levels of volume control in different locations if so desired with the use of multiple audio amplifiers. Multiple installations are accomplished by the use of one master control apparatus to activate multiple slave volume controllers, which may have different volume level set points if so desired. Further objects and advantages of the present patent will become apparent from consideration of the drawings and ensuing description.

SUMMARY

In accordance with the present invention an automatic audio volume control device for a vessel particularly applied to vessels used with participants involved in towable activities controlling audio volume as a function of vessel speed to project audio signal to participant when vessel is under way.

OBJECTS AND ADVANTAGES

Accordingly, besides the objects and advantages of the automatic audio volume control apparatus described in the present patent, several objects and advantages of the present invention are:

(a) to provide a simple apparatus to automatically control the audio volume of a vessel with adjustable activation RPM levels and volume set points;

(b) to provide time delay for activation as a function for vessel maneuvering;

(c) to provide an apparatus that can be installed as an accessory to an existing audio sound system;

(d) to provide an apparatus with multiple methods of sensing vessel speed related components;

(e) to provide an apparatus with an option for external control features to integrate with existing electrical vessel speed control devices;

(f) to provide an apparatus expandable to function independently or as master/slave configurations for a plurality of audio amplifiers;

(g) to provide an apparatus that allows automatic audio volume control with multiple adjustable low volume set points corresponding to different locations throughout the vessel.

Further objects and advantages are to provide automatic audio volume control for a vessel utilizing audio systems designed to project audio signals through loud speakers to participants in towable activities while vessel is underway. Automatic audio control relieves the operator or passengers from manually adjusting the audio level projected by the loud speakers as a function of vessel speed. Still further objects and advantages will become apparent from a consideration of the ensuing description and drawings.

FIELD OF INVENTION

This invention relates to an audio apparatus to integrate with an audio device such as a radio or the like mounted on a vessel or boat. Further discussion will use the term radio for audio device for clarity of discussion but is not limited and may apply to other audio devices commonly associated with audio systems. Use of such an audio apparatus mounted on a vessel is to increase audio volume of the radio when a vessel is underway and lower audio volume when vessel is stopped or low speed maneuvering by monitoring engine or propulsion shaft RPM. The volume level is lowered to an adjustable set point on the apparatus if vessel propulsion shaft or engine RPM is below set point and when propulsion shaft or engine RPM is higher than adjusted set point, volume level is increased after an adjustable time delay to a higher setting determined by the high volume setting on radio. The use of the vessel in particular being described is for water sports and towing participants of towable activities behind vessel. Sound level (volume) of the radio is set to be heard by both the passengers of the vessel and participants of a towable activity. The distance participants of the activity are towed by the vessel is variable, but as distance increases, volume of the radio is increased so that the participant can hear the music. Driving noises, which are partially composed of wind and engine noise increase as vessel speed increases. The audio volume level of the radio previously set, at the time of a lower vessel speed, is overcome by the driving noises, therefore the audio volume adjusting knob of the radio needs to be adjusted so that participants can hear the music projected by the loud speakers. Accordingly, adjusting volume of the radio by the operator increases the sound volume, but this is inconvenient and dangerous since the manual adjustment must be made every time the vessel speed is changed. Towable activities such as, but not limited to wake boarding, utilize audio loud speakers mounted in an elevated fashion directed rearward toward participant. The distance the participant of the towable activity or the like from the vessel varies and requires a higher volume level of the radio to be heard. If the participant falls during the activity or completes the objective, it is desirable to lower the volume of the radio when vessel speed is lowered to return to the participant either to resume activity or board the vessel.

REFERENCE NUMERALS IN DRAWINGS

| 10 | audio device, ie: radio one channel output |
|---|---|
| 12 | automatic audio volume control |
| 14 | audio device volume level V2 |
| 16 | audio device volume level V1 |
| 18 | vessel engine |
| 20 | ignition signal |
| 22 | signal counter set point |
| 24 | signal counter timer |
| 26 | audio device, ie: radio, dual channel output |
| 32 | vessel control power |
| 34 | adjustable RPM shift light |
| 36 | automatic volume control with adjustable activation and V1 set point |
| 38 | amplifier 1 |
| 40 | audio loudspeakers 1 |
| 42 | switch |
| 44 | left & right pre-amp output 1 |
| 46 | accessory external control signal |
| 48 | automatic volume control with adjustable V1 set point |
| 50 | left & right pre-amp output 2 |
| 52 | automatic volume control with adjustable activation and V1 set point and output control signal |
| 54 | slave automatic volume control with adjustable V1 set point |
| 56 | control voltage and activation signal |
| 58 | modified left & right output signal 1A |
| 60 | modified left & right output signal 2A |
| 62 | amplifier 2 |
| 64 | audio loud speakers 2 |
| 66 | modified left & right output signal 2A |
| 70 | fuse |
| 72 | dual potentiometer |
| 74 | time delay on make relay, adjustable |
| 76 | SPST-NO relay |
| 78 | time delay on break relay, adjustable |
| 80 | diode |

Figure 1:
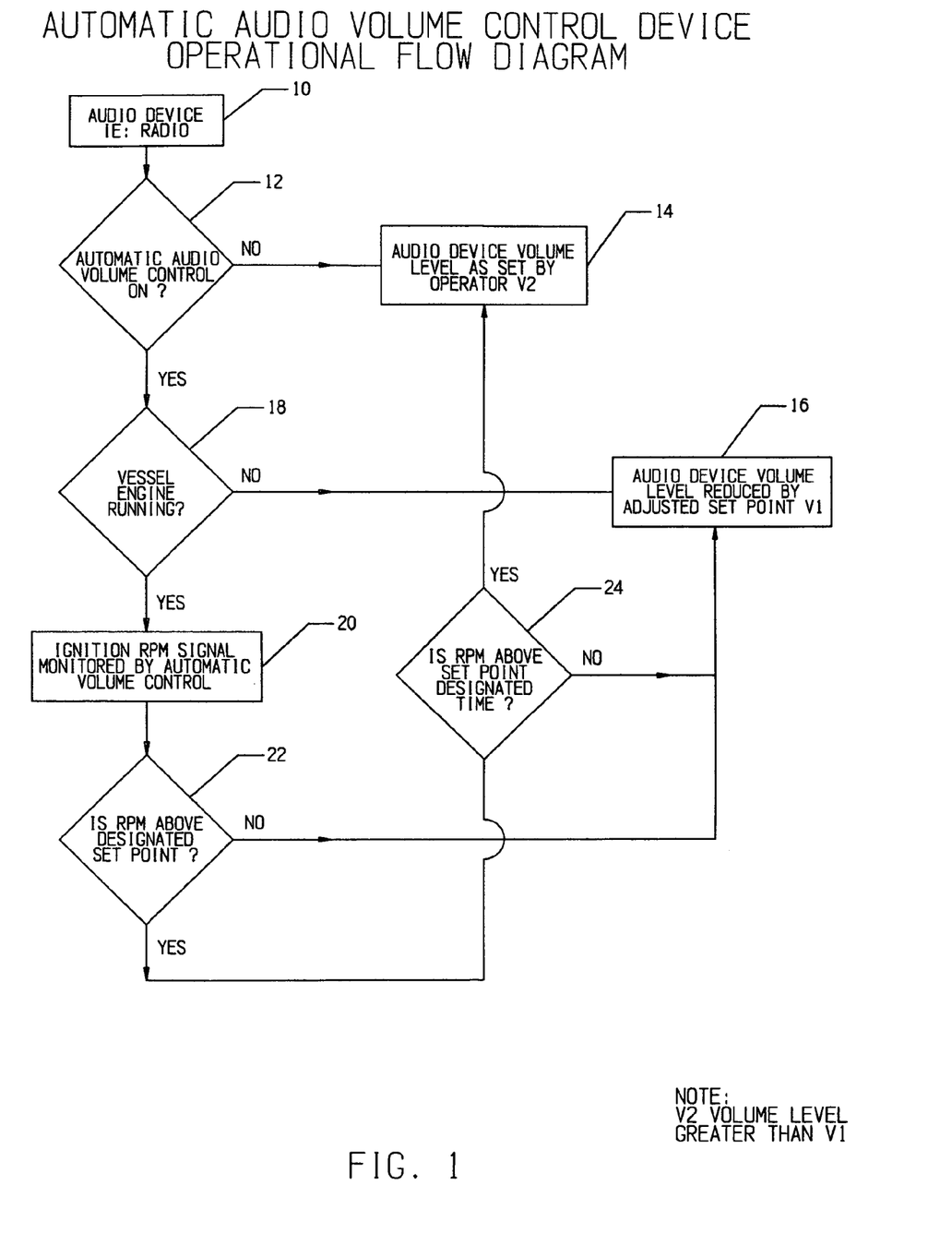
FIG. 1 is a flow diagram of vessel audio volume control apparatus according to the embodiment of the present invention.

DESCRIPTION—FIG. 1 PREFERRED EMBODIMENT

FIG. 1 flow diagram illustrates the operation of the vessel automatic audio volume control device. Radio 10 has an output signal which is operatively connected to the automatic audio volume control device 12. The radio signal maintains its current level 14, set point V2, or is reduced to level 16, set point V1 prior to amplification, which in turn is projected by audio loud speakers. Projected audio volume of the radio is lower as defined by set point V1 than by set point V2. If the vessels engine 18 is running, a signal correlating to engine RPM is monitored by automatic volume control device as shown in 20. If engine or propulsion shaft RPM is above designated set point 22, and duration of time is longer than set point of timer 24, radio volume level will increase and correlate to level as set by operator V2 as shown in 14. If engine or propulsion shaft RPM is lower than designated set point 22, radio volume level will correlate to level adjusted by operator as V1 shown in 16. It is also noted that volume level V2 is greater than volume level V1 for predetermined set points correlated to engine or propulsion shaft RPM. It is also stated that the automatic volume control device can be designed to monitor other sources correlating to the vessel speed. Electrical current generation devices such as alternators and generators exhibit a signal, which can be filtered to correlate to engine RPM. A vessels propulsion shaft or rotational engine components with a pulse generator creates a signal directly correlated to the vessel speed. The above-mentioned methods but not limited to, will also allow the vessel automatic audio volume control device to function as shown in FIG. 1. If the automatic volume control device is not energized, the radio emits sound levels solely controlled by the operator's manual settings of the radio volume controls.

DESCRIPTION—FIGS. 2-5 ADDITIONAL EMBODIMENTS

Figure 2:
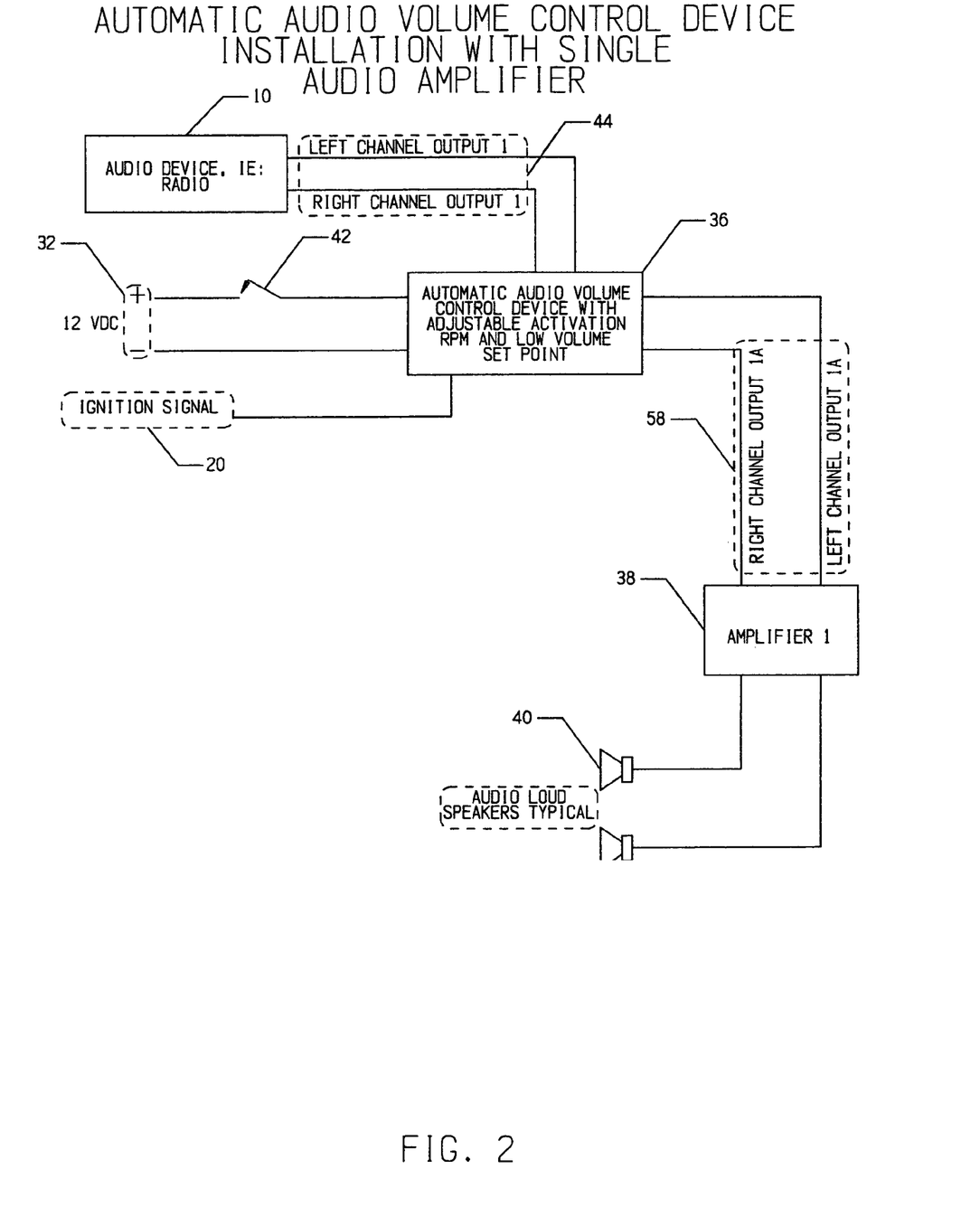
FIG. 2 is a block diagram of a typical installation of a single audio volume control device as shown in FIG. 1.

FIG. 2 block diagram illustrates a typical installation of the automatic audio volume control device 36 with the use of one audio amplifier 38. Radio 10 has left and right channel output signals 44. This output signal is operatively connected to the automatic audio volume control device 36. Automatic audio volume control device 36 is powered by control voltage but not limited to vessel control voltage 32, which in this installation is 12 VDC. Tachometer signal or ignition signal 20 is monitored by automatic audio volume control device 36. Automatic audio volume control device 36 is energized with a control voltage 32 by closing the contact with switch 42. Left and right channel output signals 58 represent the effects of the automatic volume control device as described in the flow diagram of FIG. 1. Left and right channel output signals 58, will either be equal to left and right output signals 44 designated by V2 of FIG. 1, or a lesser value as adjusted by set point V1 of FIG. 1. Left and right channel output signal 58 is operatively connected to amplifier 38 to emit sound from the loud speakers 40.

Figure 3:
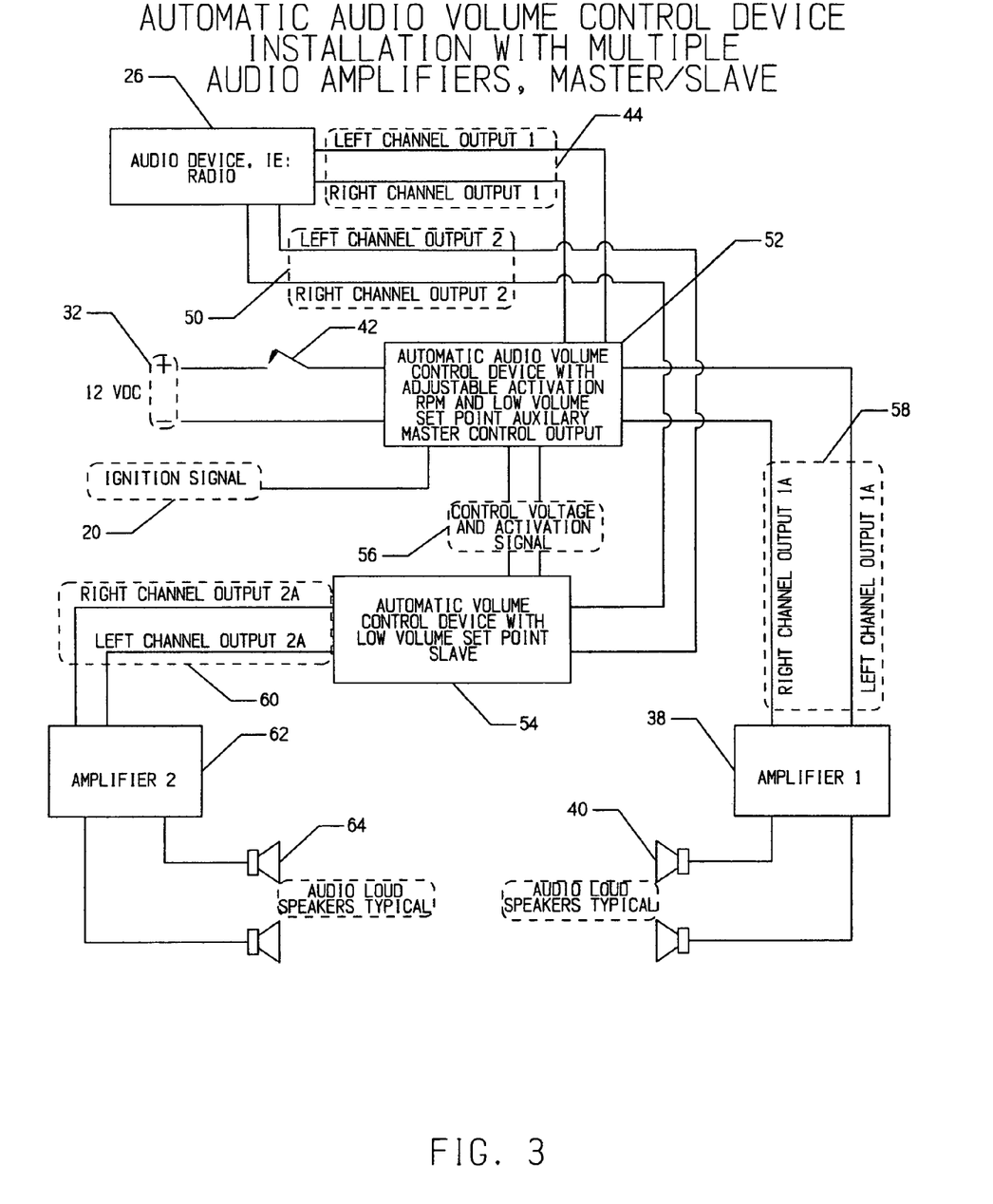
FIG. 3 is a block diagram of a typical installation of multiple audio volume control devices as shown in FIG. 1, with a master control device, an output control voltage to slave audio volume control device.

FIG. 3 block diagram illustrates a typical installation of two automatic audio volume control devices, 52 and 54 with the use of two amplifiers, 38 and 62. A master automatic audio volume control device 52 and slave automatic audio volume control device 54. Radio 26 has left and right channel output signals 44 and 50. Output signal 44 is operatively connected to automatic audio volume control device 52. Automatic audio volume control device 52 is powered by control voltage but not limited to vessel control voltage 32, which in this installation is 12 VDC. Tachometer signal or ignition signal 20 is monitored by automatic audio volume control device 52. Automatic audio volume control device 52 is energized with a control voltage 32 by closing the contact with switch 42. Left and right channel output signals 58 represent the effects of the automatic audio volume control device as described in the flow diagram of FIG. 1. Left and right channel output signals 58, will either be equal to left and right output signals 44 designated by V2 of FIG. 1, or a lesser value as adjusted by set point V1 of FIG. 1. Left and right channel output signal 58 is operatively connected to amplifier 38 to emit sound from the loud speakers 40. Radio output signal 50 is operatively connected to the automatic audio volume control device 54. Automatic audio volume control device 54 is powered by automatic audio volume control device 52 control voltage. Automatic audio volume control device 54 is activated by RPM set point as shown in FIG. 1 22 by automatic audio volume control device 52. Automatic audio volume control device 54 will operate in parallel with audio volume control device 52 with a left and right channel output signal 60. The advantage of the installation as shown in FIG. 3 is that each automatic audio volume control device 52 and 54 can have independent set points of volume control operatively connected to amplifiers 38 and 62 respectively. Installation as shown in FIG. 3 allows sound volumes emitted by loud speakers 40 and 64 to be variable and tuned to desirable sound levels correlated to the loudspeaker locations, allowing the vessel operator to have preset volume levels correlated to vessel speed and locations of the loud speakers with respect to passengers of the vessel and participants of towable water sport activities.

Figure 4:
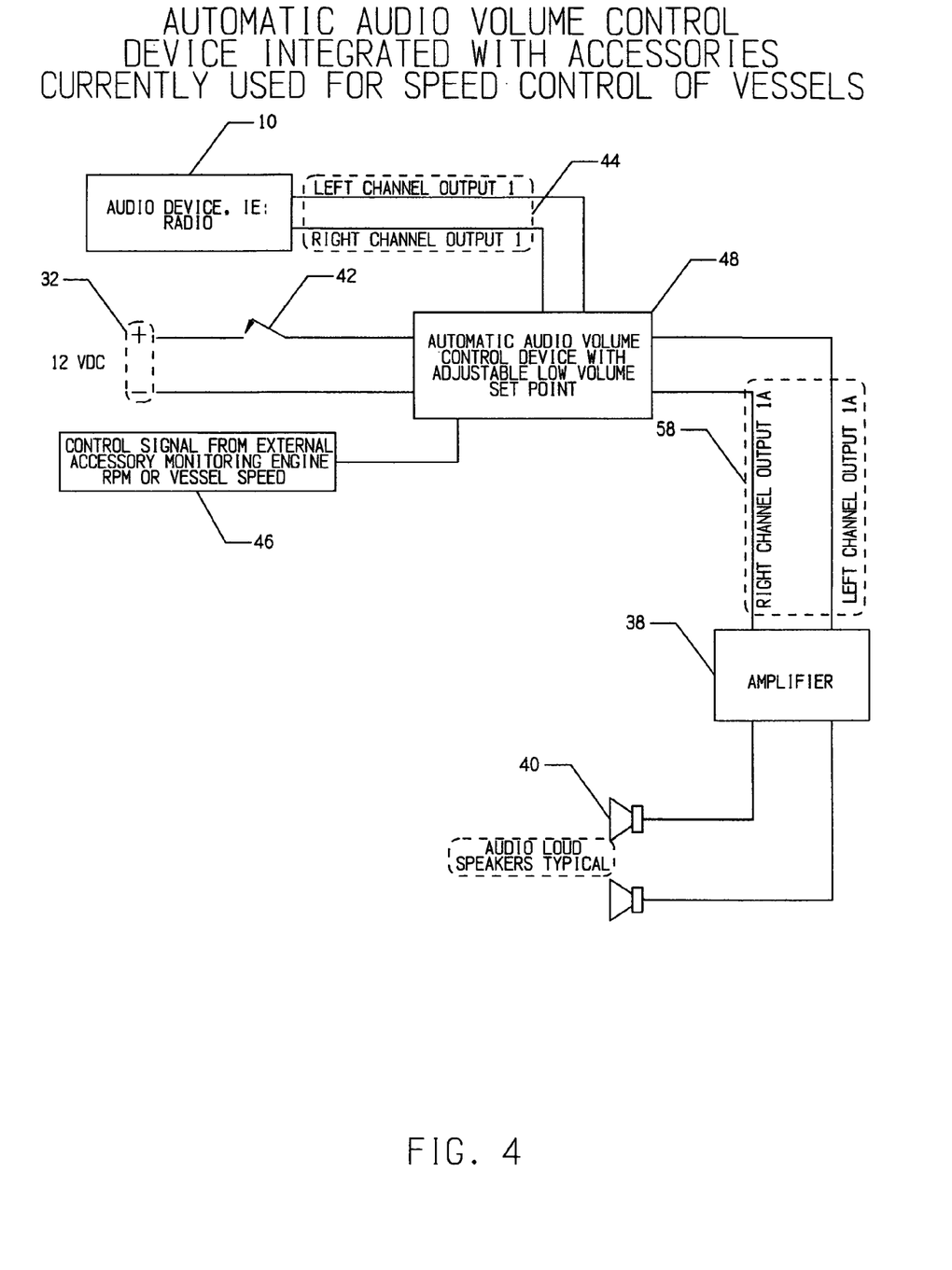
FIG. 4 is a block diagram of a typical installation of a sound device as shown in FIG. 1 with a control voltage from an external speed control accessory to work in conjunction with the disclosed invention.

FIG. 4 block diagram illustrates a typical installation of an automatic audio volume control device integrated with an external control signal from an existing vessel speed control device. Radio 10 has left and right channel output signals 44. Output signal 44 is operatively connected to the automatic audio volume control device 48. Automatic audio volume control device 48 is powered by control voltage but not limited to vessel control voltage 32, which in this installation is 12 VDC. A control signal from an external accessory monitoring engine RPM or vessel speed 46 is used in conjunction with audio volume control device 48. Automatic audio volume control device 48 is energized with a control voltage 32 by closing the contact with switch 42. Left and right channel output signals 58 represent the effects of the automatic volume control device as described in the flow diagram of FIG. 1. Left and right channel output signals 58, will either be equal to the left and right output signals 44 designated by V2 of FIG. 1, or a lesser value as adjusted by set point V1 of FIG. 1. Left and right channel output signal 58 is operatively connected to amplifier 38 to emit sound from the loud speakers 40.

Figure 5:
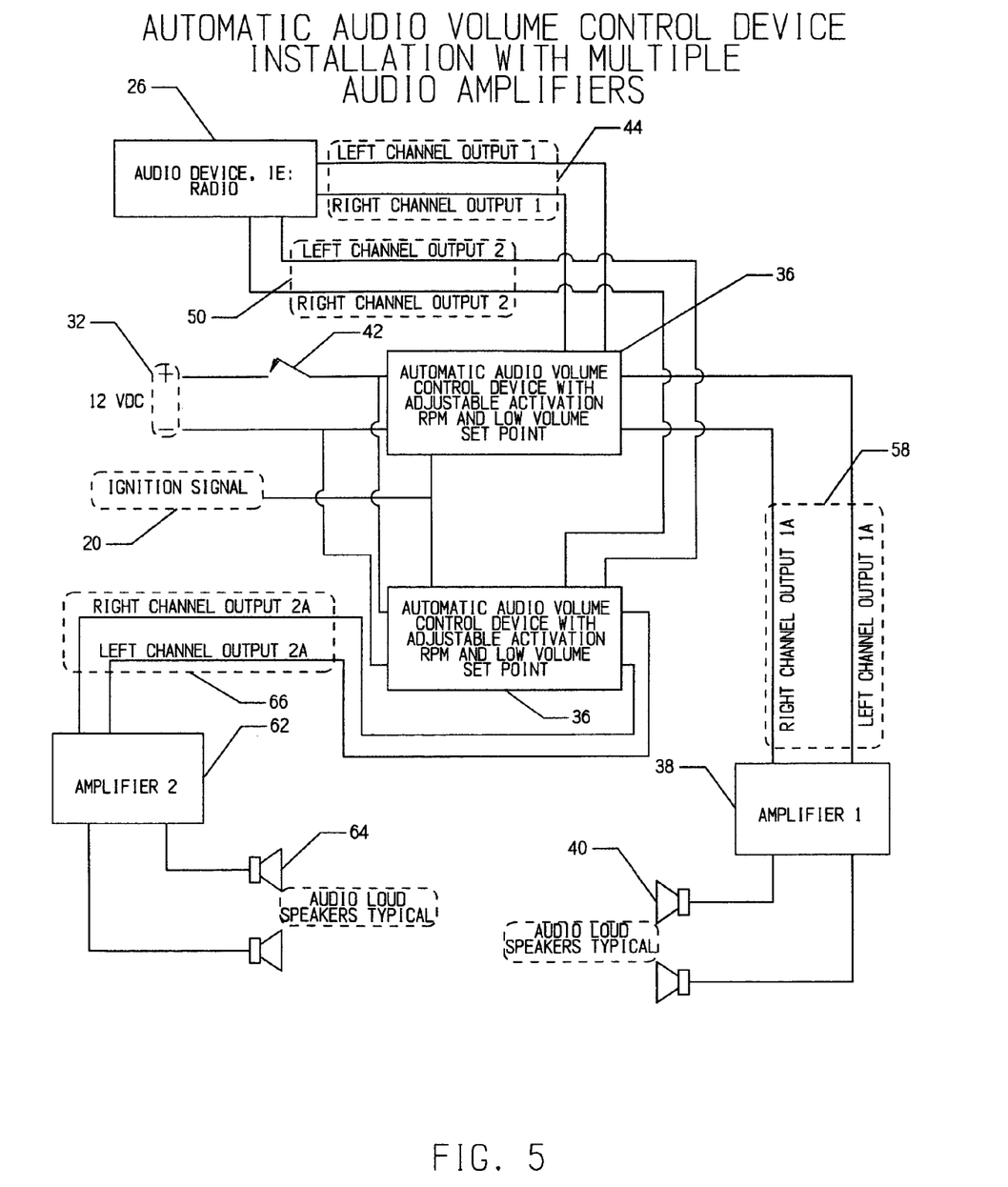
FIG. 5 is a block diagram of a typical installation of multiple audio volume control devices as shown in FIG. 1, controlling multiple amplifiers independently.

FIG. 5 block diagram illustrates a typical installation of multiple automatic audio volume control devices 36 with the use of two amplifiers, 58 and 62. Radio 26 has left and right channel output signals 44 and 50. Output signals 44 and 50 are operatively and each independently connected to automatic audio volume control devices 36. Automatic audio volume control devices 36 are powered by control voltage but not limited to vessel control voltage 32, which in this installation is 12 VDC. Tachometer signal or ignition signal 20 is monitored by each automatic audio volume control device 36. Automatic audio volume control devices 36 are energized with a control voltage 32 by closing the contact with switch 42. Left and right channel output signals 58 and 66 respectively represent the effects of the automatic volume control device as described in the flow diagram of FIG. 1. Left and right channel output signals 58 and 66, will either be equal to the left and right output signals 44 and 50 designated by V2 of FIG. 1, or a lesser value as adjusted by set point V1 of FIG. 1. Left and right channel output signal 58 is operatively connected to amplifier 38 to emit sound from the loud speakers 40. Radio output signal 50 is operatively connected to the automatic audio volume control device 36 as previously described. Automatic audio volume control devices 36 will operate independently with left and right channel output signals 58 and 66 respectively. The advantage of the installation as shown in FIG. 5 is that multiple automatic audio volume control devices 36 can have independent set points both of volume control and RPM activation operatively connected to amplifiers 38 and 62 respectively. This allows sound volumes emitted by loud speakers 40 and 64 to be variable and tuned to desirable sound levels correlated to the loudspeaker locations. The vessel operator may have preset volume levels correlated to vessel speed and locations of the loud speakers with respect to passengers of the vessel and participants of towable water sport activities.

Figure 6:
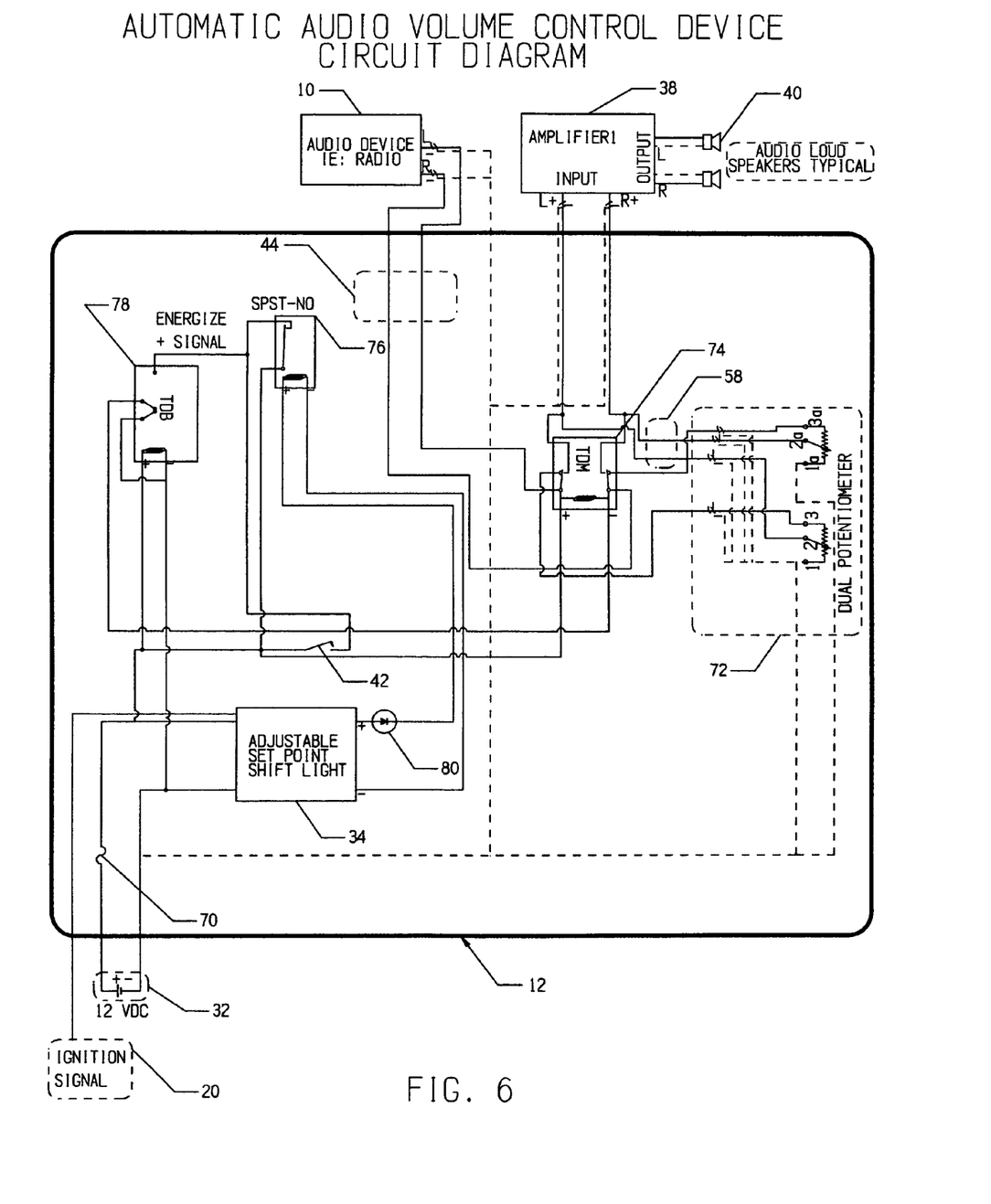
FIG. 6 is a simple circuit diagram with commercially available components to build basic automatic audio volume control device.

Operation—FIG. 6

FIG. 6 is an example circuit utilizing common commercially available components to build an automatic audio volume control apparatus 12 as discussed in FIG. 1. An adjustable RPM activated shift light 34 is connected to vessel control voltage 32 which in this case it 12 VDC and a fuse 70 inline protecting the entire circuit of audio volume control. The shift light 34 in this configuration maintains a constant positive (+) voltage and switches the negative (−) voltage. The positive leg from the shift light 34 has a diode 80 installed to prevent damage from another source in the circuit. The switched voltage from the shift light 34 powers a SPST-NO relay 76. Voltage provided by relay 76 energizes a time delay on break relay 78 if the voltage signal from the shift light is inconsistent. Relay 78 is used to maintain a constant voltage source powering a DPDT time delay on make relay 74. Relay 74 is used as a timer to allow activation of the device after an adjustable predetermined set time. Time delay applies to vessels maneuvering and using short durations of high engine or propulsion shaft RPM but not actually accelerating to vessel speeds pertaining to higher audio volume levels. Radio 10 has left and right channel output 44 operatively connected to relay 74 directing the output signals. Output 44 channels pass either directly through relay 74 operatively connected to amplifier 38 or the signal is modified by a dual potentiometer 72 to left and right channel output 58 operatively connected to amplifier 38. Potentiometer 72 can be manually set to a desired lower audio level V1 than as set by the audio volume control on radio 10, at a higher level V2. The state of relay 74 determines if output 44 remains constant or modified to output 58 amplified by amplifier 38 operatively connected to loud speakers 40, thus varying volume as a function of vessel engine RPM correlating to vessel speed. The automatic audio volume control device is bypassed for manual operation by closing the contact in switch 42 ultimately supplying voltage to relay 74, allowing left and right channel output 44 a direct connection to amplifier 38 and the manual audio volume setting on the radio 10 is not modified. The circuit shown in FIG. 6 is just one example with off the shelf components. A commercially viable product would have specific components integrated into a circuit board lowering overall component cost. A microprocessor, digital potentiometers or variable gain amplifiers could also be incorporated into the circuit to further simplify and decrease the number of components.

It is readily apparent that the above described automatic audio volume control apparatus meets all the objectives mentioned above and also has the advantage of wide commercial utility. It should be understood that the specific form of the invention hereinabove described is intended to be representative only, as certain modifications within the scope of these teachings will be apparent to those skilled in the art.

I claim:

1. An audio apparatus for a vessel having an audio device and an automatic volume control device adapted to provide an increased volume level projected to a participant behind the vessel wherein the automatic volume control device comprises:
   a circuit that receives an audio output signal from an audio device and is adapted to deliver an output signal at an audio volume level to be heard by the participant behind the vessel, depending on the velocity of the vessel, and having a delay circuit that is adapted to time delay the delivery of the output signal at an audio volume level to be heard by the participant behind the vessel.

2. The audio apparatus of claim 1, wherein the control circuit utilizes one of engine RPM and propulsion shaft RPM to determine the velocity of the vessel.

3. The audio apparatus of claim 1, wherein the circuit delivers the adjusted output signal at a first set point and audio output level if the velocity of the vessel is less than a predetermined velocity set point.

4. The audio apparatus of claim 3, wherein the circuit delivers the adjusted output signal at a second set point and audio output level if the velocity of the vessel is greater than the predetermined velocity set point.

5. The audio apparatus of claim 4, wherein the first and second set point for audio output levels are manually adjustable.

6. The audio apparatus of claim 4, wherein the second audio output level is greater than the first audio output level.

7. The audio apparatus of claim 1, further comprising a slave signal output circuit for providing an activation signal to a slave audio apparatus providing a second adjusted output audio signal.

8. A method of adjusting an output level of an audio device on a vessel, comprising;
   determining the velocity of the vessel;
   comparing the determined velocity to a predetermined velocity set point of velocity set by the operator of the vessel;
   delaying the delivery of an adjusted output level for a predetermined period of time;
   delivering the adjusted output level for a participant some distance behind the vessel based on the comparison.

9. The method of claim 8, wherein the determining the velocity includes receiving one of engine RPM and propulsion shaft RPM.

10. The method of claim 8, further comprising keeping the output signal constant if the determined velocity is less than the predetermined velocity set point.

11. The method of claim 8, wherein the adjusted output signal is delivered at a first set point and audio out-put level if the velocity of the vessel is less than the predetermined velocity set point.

12. The method of claim 11, wherein the adjusted output signal delivered at a second set point and audio output level if the velocity of the vessel is greater than the predetermined velocity set point.

13. The method of claim 12, wherein the first and second audio output levels are manually adjustable.

14. The method of claim 12, wherein the second audio output level is greater than the first audio output level.

15. An audio apparatus for a vessel having an audio device and a volume control device adapted to provide an increased volume level projected to a participant behind the vessel, wherein the volume control device comprises:
   a circuit that receives an audio output signal from an audio device and is adapted to deliver an audio volume level depending on the velocity of the vessel;
   wherein the circuit delivers a first audio volume level for the operator of the vessel if the velocity of the vessel is less than a predetermined value;
   wherein the circuit delivers a second audio volume level for the participant some distance behind the vessel if the velocity of the vessel is greater than the predetermined velocity set point and the second audio volume level is greater than the first audio volume level.

16. The audio apparatus of claim 15, wherein the circuit includes a delay circuit that is adapted to time delay the adjusted output signal.

17. The audio apparatus of claim 15, wherein the first and second audio output levels are manually adjustable.

18. A method of adjusting an audio output signal of an audio device on a vessel, comprising;
   determining the velocity of the vessel;
   comparing the determined velocity to a predetermined velocity set point;
   delivering a first audio output level for the operator of the vessel when the velocity of the vessel is less than the predetermined velocity set point;
   delivering a second audio output level for the participant some distance behind the vessel when the velocity of the vessel is greater than the predetermined velocity set point and the second audio volume level is greater than the first audio volume level.

19. The method of claim 18, further comprising delaying the adjusting of the audio output signal for a predetermined period of time.

20. The method of claim 18, wherein the first and second audio output levels are manually adjustable.

* * * * *